United States Patent
Chen et al.

(10) Patent No.: US 10,615,846 B2
(45) Date of Patent: Apr. 7, 2020

(54) TRANSMISSION-PATH DEGRADATION DETECTION APPARATUS

(71) Applicant: DENSO CORPORATION, Kariya, Aichi-pref. (JP)

(72) Inventors: Chao Chen, Kariya (JP); Shigeki Otsuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 31 days.

(21) Appl. No.: 15/770,507

(22) PCT Filed: Nov. 28, 2016

(86) PCT No.: PCT/JP2016/085181
§ 371 (c)(1),
(2) Date: Apr. 24, 2018

(87) PCT Pub. No.: WO2017/126229
PCT Pub. Date: Jul. 27, 2017

(65) Prior Publication Data
US 2018/0302122 A1    Oct. 18, 2018

(30) Foreign Application Priority Data
Jan. 18, 2016   (JP) .................. 2016-007112

(51) Int. Cl.
*H04B 3/493*     (2015.01)
*G01R 31/11*    (2006.01)
(Continued)

(52) U.S. Cl.
CPC ............. *H04B 3/493* (2015.01); *G01R 31/11* (2013.01); *H04B 3/06* (2013.01); *H04B 3/23* (2013.01); *H04M 9/082* (2013.01)

(58) Field of Classification Search
CPC .......... H04B 3/493; H04B 3/23; H04B 3/06; H04M 9/082; G01R 31/11
See application file for complete search history.

(56) References Cited

U.S. PATENT DOCUMENTS

| 4,859,951 A | 8/1989 | Cole et al. |
|---|---|---|
| 2001/0023392 A1 | 9/2001 | Nakatsuhama et al. |

(Continued)

FOREIGN PATENT DOCUMENTS

| JP | H04-365231 A | 12/1992 |
|---|---|---|
| JP | 2012-149914 A | 8/2012 |

OTHER PUBLICATIONS

David M. Horan et al., "A Novel Pulse Echo Correlation Tool for Transmission Path Testing and Fault Diagnosis", Journal of Computers, vol. 1, No. 1, Apr. 2006, pp. 31-39.
(Continued)

*Primary Examiner* — Daniel R Miller
(74) *Attorney, Agent, or Firm* — Posz Law Group, PLC

(57) ABSTRACT

A transmission-path degradation detection apparatus includes a transmission path of a transmission system and plural communication devices connected to the transmission path. A signal generation part is provided in one communication device of the plural communication devices for generating a pseudo-communication signal. A degradation detection part is provided in one communication device of the plural communication devices for detecting a degradation of the transmission path based on a reception of the pseudo-communication signal passing through the transmission path.

10 Claims, 9 Drawing Sheets

(51) Int. Cl.
*H04M 9/08* (2006.01)
*H04B 3/06* (2006.01)
*H04B 3/23* (2006.01)

(56) References Cited

U.S. PATENT DOCUMENTS

| | | | | |
|---|---|---|---|---|
| 2005/0281343 | A1* | 12/2005 | Hsu | H04L 25/03343 |
| | | | | 375/257 |
| 2008/0031142 | A1* | 2/2008 | Wang | H04L 43/50 |
| | | | | 370/242 |
| 2012/0192043 | A1* | 7/2012 | Jiang | G01R 31/31716 |
| | | | | 714/799 |
| 2013/0136030 | A1* | 5/2013 | Xiao | H04L 43/0888 |
| | | | | 370/253 |
| 2018/0164370 | A1* | 6/2018 | Kumar | G01R 31/31703 |

OTHER PUBLICATIONS

Eric van Doorn et al., "Radical Extension of Time Domain Reflectometry for Detection and Location of Flaws in Aircraft Wiring Systems", 9th Joint FAA/DoD/NASA Aging Aircraft Conference, retrieved May 2016, pp. 1-8.

* cited by examiner

| COEFFICIENT | BEFORE DEGRADATION | AFTER DEGRADATION |
|---|---|---|
| c(1) | 0.126 | 0.247 |
| c(2) | 0.014 | 0.018 |
| c(3) | -0.017 | -0.022 |
| c(4) | 0.001 | -0.003 |
| c(5) | 0.003 | 0.001 |
| c(6) | -0.002 | -0.002 |

| COEFFICIENT | BEFORE DEGRADATION | AFTER DEGRADATION |
|---|---|---|
| a(1) | 0.875 | 0.649 |
| a(2) | −0.104 | −0.127 |
| a(3) | 0.016 | −0.018 |
| a(4) | 0.002 | 0.003 |
| a(5) | −0.003 | 0.002 |
| a(6) | 0.001 | −0.001 |
| a(7) | 0.002 | 0.001 |
| a(8) | −0.001 | −0.001 |

TRANSMISSION-PATH DEGRADATION DETECTION APPARATUS

CROSS REFERENCE TO RELATED APPLICATIONS

The present application is a U.S. national phase of International Application No. PCT/JP2016/085181 filed on Nov. 28, 2016 and is based on Japanese Patent Application No. 2016-7112 filed on Jan. 18, 2016, the contents of which are incorporated herein by reference.

TECHNICAL FIELD

The present disclosure relates to a transmission-path degradation detection apparatus, which detects a degradation state of a transmission path for a communication signal.

BACKGROUND ART

A detection apparatus for detecting a failure such as a disconnection of a transmission path for a communication signal is known conventionally. It has, however, no configuration to detect a state of degradation of the transmission path before the transmission path fails. As one method for detecting the degradation of the transmission path, a total period of usage is counted and the degradation is predicted based on a counted period of usage. Since various factors such as environment of usage affect, it is not possible to predict the degradation based on only the period of usage.

PRIOR ART LITERATURES

Patent Literature

Patent Literature 1: JP 2012-149914A

SUMMARY OF INVENTION

Patent literature 1 discloses a TDR (Time Domain Reflectometry) method, which inspects degradation by applying a pulse wave. This TDR method is effective in case of inspecting a transmission path for one-to-one communication. However, although it is possible to detect a disconnection or connection failure of the transmission path, it is not possible to detect degradation because of insufficient sensitivity. The TDR method needs dedicated inspection devices such as a pulse generator, probe and oscilloscope.

As another apparatus for inspecting a transmission path for one-to-one communication, a detection apparatus, which detects whether a reply signal is received, is also known. In case that a communication device of a communication partner is not an active type, the communication device of the communication partner is required to have an inspection function, which adds costs.

The present disclosure has an object to provide a transmission-path degradation detection apparatus, which not only detects degradation of a transmission path before a failure of the transmission path without necessitating a dedicated inspection device but also suppresses an increase of a manufacturing cost.

According to a first aspect of the present disclosure, a degradation detection apparatus comprises a transmission path of a transmission system, plural communication devices connected to the transmission path, a signal generating part, which is provided in one communication device of the plural communication devices for generating a pseudo-communication signal, and a degradation detection part, which is provided in one communication device of the plural communication devices, for detecting a degradation of the transmission path based on the pseudo-communication signal received through the transmission path.

BRIEF DESCRIPTION OF DRAWINGS

The above and other objects, features and advantages of the present disclosure will become more apparent from the following detailed description made with reference to the accompanying drawings.

EMBODIMENT FOR CARRYING OUT INVENTION

First Embodiment

Figure 1:
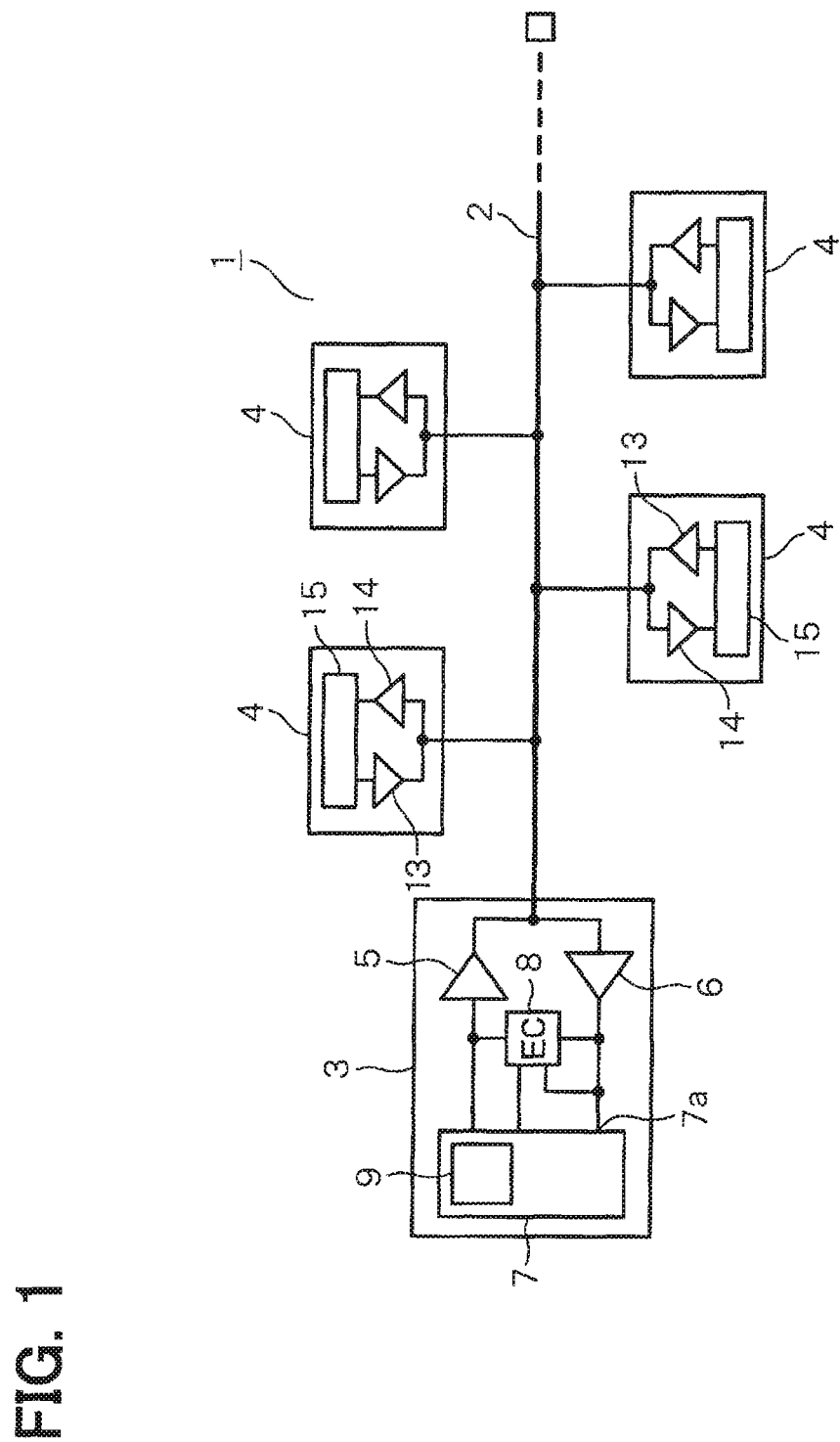
FIG. 1 is an electric configuration diagram showing a whole general configuration of a transmission system according to a first embodiment.

A first embodiment will be described below with reference to FIG. 1 to FIG. 5. A transmission system 1 according to the present embodiment is configured to be capable of communication by way of, for example, a bus-connected communication. As shown in FIG. 1, the transmission system 1 is configured with a transmission path 2, which is a communication line, and plural communication devices 3 and 4 connected to the transmission path 2.

The transmission path 2 is formed of a transmission path, which is a single end type for example. The transmission path 2 may be formed of a transmission path, which is a differential transmission type. The communication device 3 is a master communication device. The communication device 4 is a slave communication device. One or more (four in FIG. 1, for example) slave communication devices 4 are connected to the transmission path 2.

The master communication device 3 has a transmitting function and a receiving function and includes a driver circuit 5, a receiver circuit 6, a master control circuit 7 and an echo canceller 8. The driver circuit 5 receives a transmission data signal (that is, digital signal) from the master control circuit 7, generates a transmission signal (that is, analog pulse signal) and outputs a generated transmission signal to the transmission path 2. The driver circuit 5 includes a transmitter-side analog circuit and DAC (Digital Analog Converter).

The receiver circuit 6 receives a voltage signal (that is, analog pulse signal) from the transmission path 2, generates a reception signal (that is, digital signal) and outputs a generated reception signal to the master control circuit 7. The receiver circuit 6 includes a receiver-side analog circuit and ADC (Analog Digital Converter).

The master control circuit 7 has functions of transmitting the transmission data signal to the driver circuit 5 and receiving the reception signal from the receiver circuit 6. The master control circuit 7 has a function of a degradation detection part. The master control circuit 7 has a function of correcting a distorted reception signal in case that the reception signal received from the receiver circuit 6 is distorted.

The master control circuit 7 is provided with a signal generator 9 for generating, for example, a PRBS7 signal, which is one type of pseudo random signals, as a pseudo-communication signal. The signal generator 9 has a function of a signal generating part. The master control circuit 7 outputs, as the transmission signal, the PRBS7 signal generated by the signal generator 9 to the transmission path 2 through the driver circuit 5.

The echo canceller 8 has a function of cancelling an echo of the transmission signal (that is, PRBS7 signal), that is, a reflection signal from the transmission path 2. The echo canceller 8 has a function of a filtering coefficient control circuit, A detailed configuration and operation of the echo canceller 8 will be described later.

The slave communication device 4 has a transmitting function and a receiving function and includes a driver circuit 13, a receiver circuit 14 and a slave control circuit 15. The driver circuit 13 receives a transmission data signal (that is, digital signal) from the slave control circuit 15, generates a transmission signal (for example, maintaining digital signal) and outputs a generated transmission signal to the transmission path 2. The receiver circuit 14 receives a voltage signal (that is, analog pulse signal) from the transmission path 2, digitizes a reception signal in a simplified manner by using a simple comparison circuit and outputs a simplified digital signal as the reception signal to the slave control circuit 15.

The slave control circuit 15 has functions of transmitting the transmission data signal to the driver circuit 13 and receiving the reception signal from the receiver circuit 14. Differently from the master communication device 3, the slave communication device 4 has no functions of a processing circuit for correcting distortion of the reception signal nor a circuit for cancelling an echo of the transmission signal. That is, the slave communication device 4 is referred to as a slave, because it operates passively in comparison to the master communication device 3.

The detailed configuration and operation of the echo canceller 8 will be described next with reference to FIG. 2 to FIG. 5. The echo canceller 8 is configured to automatically adjust filtering coefficients so that, when the transmission signal (that is, PRBS7 signal) is outputted from the master control circuit 7 to the transmission path 2 through the driver circuit 5, a signal reflected by the transmission path 2 and returned to the master communication device 3, that is, the signal inputted to a receiving terminal 7a of the master control circuit 7, is controlled to zero.

Specifically, the echo canceller 8 controls the signal inputted to the receiving terminal 7a of the master control circuit 7 to zero by generating a copy of the echo in an internal circuit and subtracting it from the reflection signal.

The copy of the echo is generated based on the following equation.

$$\text{Echo(copy)} = c(1) \times x(1) + c(2) \times x(2) + \ldots + c(n) \times x(n) \tag{1}$$

Here, $c(n)$ is a filtering coefficient of the echo canceller and $x(n)$ is the PRBS7 signal, which is the transmission signal transmitted from the master communication device 3 (that is, source of echo).

Figure 2:
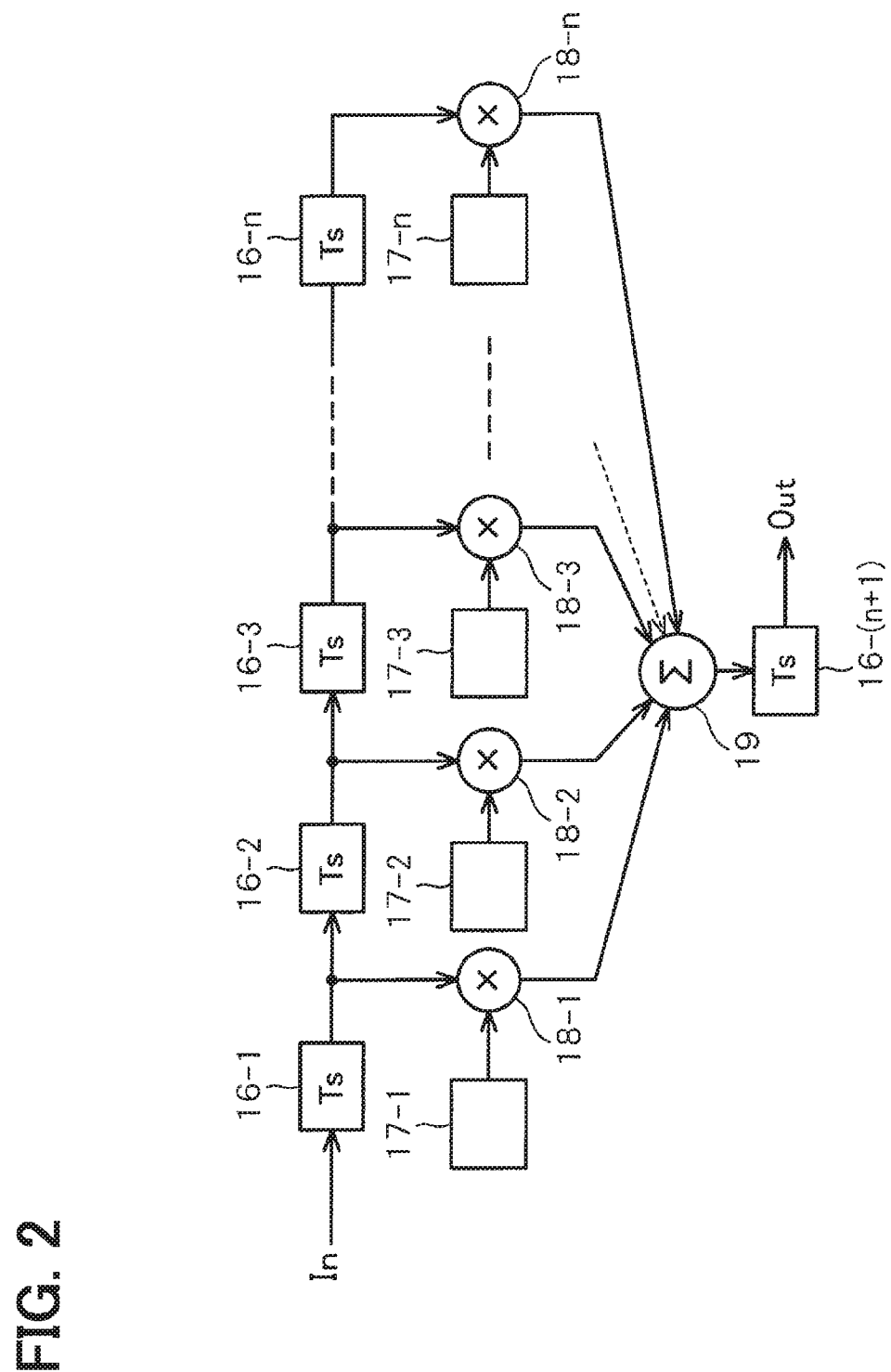
FIG. 2 is a block diagram of an echo canceller.

A detailed configuration of the echo canceller 8 is shown in FIG. 2. The echo canceller 8 is formed of (n+1) units of delay circuits 16-1 to 16-$n$ and 16-($n$+1), (n) units of filtering coefficient control circuits 17-1 to 17-$n$, (n) units of multipliers 18-1 to 18-$n$ and an adder 19.

The delay circuits 16-1 to 16-$n$ and 16-($n$+1) are circuits, which delay the input signals by predetermined periods, respectively. The filtering coefficient control circuits 17-1 to 17-$n$ have functions of automatically adjusting the filtering coefficients $c(1)$ to $c(n)$ so that the signal inputted to the receiving terminal 7a of the master control circuit 7 is zeroed and outputting adjusted filtering coefficients $c(1)$ to $c(n)$. The multipliers 18-1 to 18-$n$ calculate multiplication portions in the equation (1). The adder 19 calculates addition portions in the equation (1). It is preferred to use, as an algorithm for adjusting the filtering coefficients, LMS (Least Mean Square) and the like. However, other algorithms may alternatively be used. Further, a detail value "n" is set preferably in correspondence to a state of the transmission path 2.

Since the filtering coefficients $c(1)$ to $c(n)$ of the echo canceller 8 are data corresponding to a magnitude of the signal, which is returned by reflection (that is, echo), these are data corresponding to the transmission characteristic of the transmission path 2. Accordingly, it is possible to check whether the transmission path 2 is degraded by checking a change in each value of the filtering coefficients $c(1)$ to $c(n)$.

In the present embodiment, the master control circuit 7 acquires pre-degradation filtering coefficients $c(1)$ to $c(n)$ of the transmission path 2 (for example, at time of factory shipment or initial production) from the echo canceller 8 and stores in an internal memory (for example, EEPROM or flash memory). The master control circuit 7 is configured to acquire, when the echo canceller 8 operates to control the signal inputted to the receiving terminal 7a of the master control circuit 7 to zero, the echo filtering coefficients $c(1)$ to $c(n)$ at that time and check whether the transmission path 2 is degraded by comparing the acquired filtering coefficients $c(1)$ to $c(n)$ and the pre-degradation filtering coefficients $c(1)$ to $c(n)$ stored in the memory. The processing of the echo canceller 8 is executed mainly in a start-up process, which is until normal communication is executed. The processing of the echo canceller 8 is preferably executed periodically (for example, once in a day or week).

Figure 3:
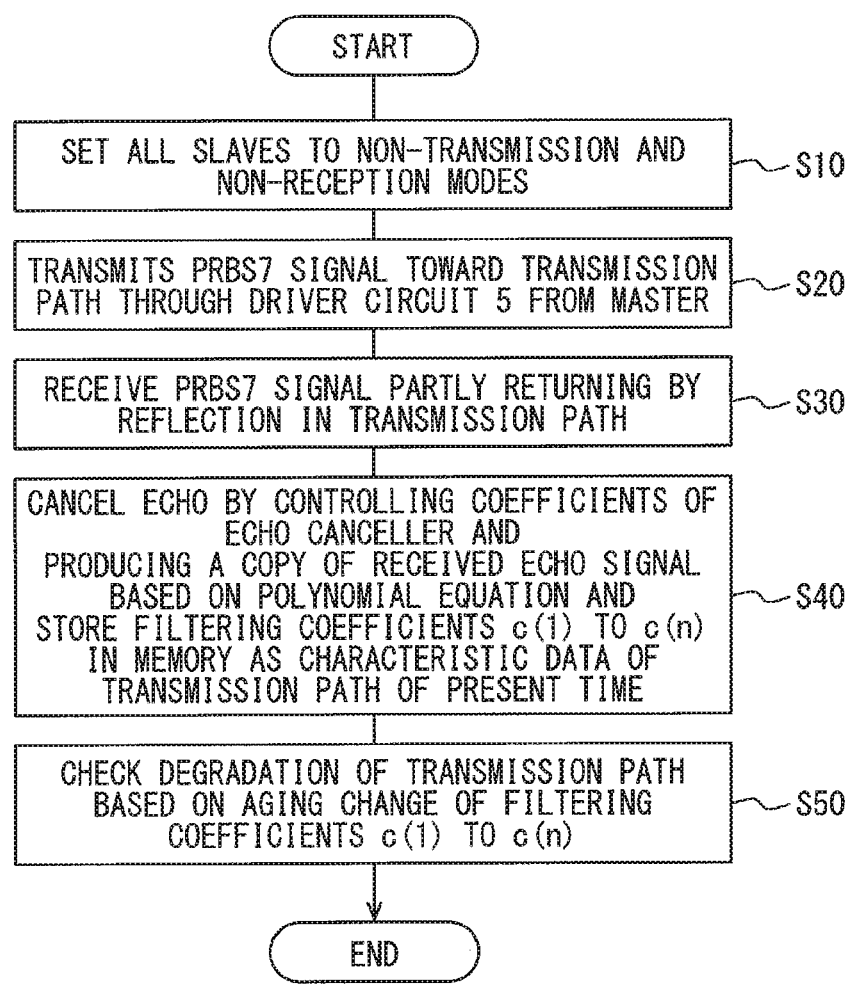
FIG. 3 is a flowchart of degradation check control.

A flowchart of FIG. 3 shows control contents for checking degradation of the transmission path in the control of the master control circuit 7 of the master communication device 3. First, at step S10, the master control circuit 7 transmits a control signal for stopping transmission and reception to all slave communication devices 4 and sets all the slave communication devices 4 to be in an operation mode of non-transmission and non-reception. Next, at step S20, the master control circuit 7 transmits (that is, outputs) the PRBS7 signal to the transmission path 2 through the driver circuit 5.

Then, at step S30, the master control circuit 7 receives a reflection wave (that is, echo signal), which is a part of the PRBS7 signal reflected in the transmission path 2 and returned to the master communication device 3, through the receiver circuit 6. At step S40, the master control circuit 7 cancels the echo by controlling the filtering coefficients $c(1)$ to $c(n)$ of the filtering coefficients control circuits 17-1 to 17-$n$ of the echo canceller 8, generating a copy of the echo signal and subtracting from the echo signal (that is, reflection signal). In this case, the master control circuit 7 controls the signal inputted to the receiving terminal 7$a$ of the master control circuit 7 to zero. Since the filtering coefficients c(1) to c(n) are characteristic data, which indicate a present characteristic of the transmission path 2, these filtering coefficients c(1) to c(n) are stored in the memory in the master control circuit 7.

Then, at step S50, the master control circuit 7 checks the degradation of the transmission path 2 based on a secular change of the filtering coefficients c(1) to c(n), that is, by comparing the pre-degradation filtering coefficients c(1) to c(n), which are stored in the memory before degradation, for example, at shipping time, with latest filtering coefficients c(1) to c(n) stored in the memory.

Figures 4, 5:
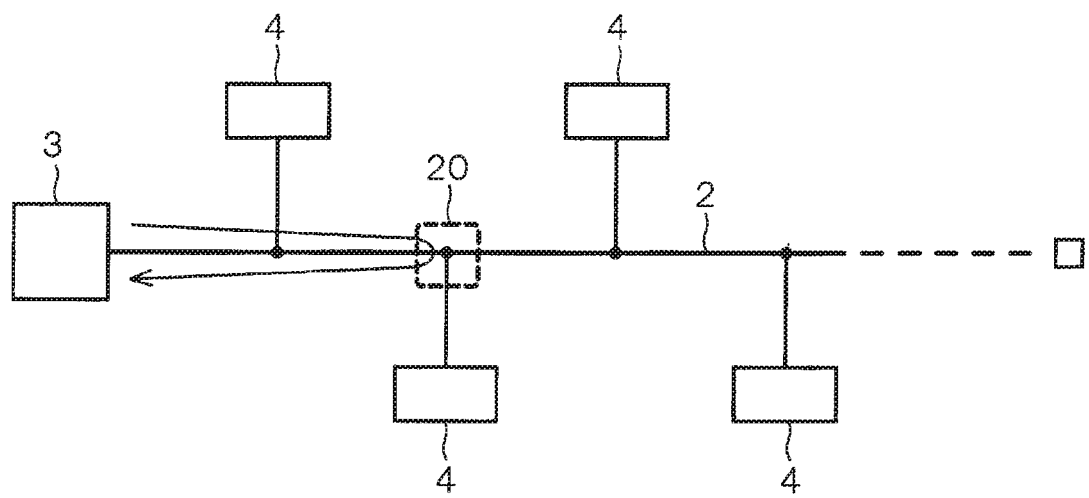
FIG. 4 is a diagram explaining a location of degradation in the transmission system.
FIG. 5 is a diagram showing an example of variations of filtering coefficients c(1) to c(n)

It is assumed here that a connector 20, which connects the second slave communication device 4 and the transmission path 2 as shown in FIG. 4, is degraded for example. In this case, the coefficient c(1) among the filtering coefficients c(1) to c(n) changes largely in an increasing direction as indicated in a table of FIG. 5. Accordingly, the master control circuit 7 is configured to determine that the transmission path 2 is degraded in case that such a large change as indicated in the table of FIG. 5 is detected. The master control circuit 7 is configured to notify a user of a message or the like, which indicates the degradation of the transmission path 2, in case that the degradation of the transmission path 2 is determined. Thus the control shown in FIG. 3 is finished.

The large change in the filtering coefficients c(1) to c(n) described above is considered to arise from impedance mismatching, which is caused by degradation, disconnection or the like of the transmission path 2. The master control circuit 7 is configured to execute the control shown in FIG. 3 in the start-up process or periodically.

In the present embodiment configured as described above, the master control circuit 7 checks whether the transmission path 2 is degraded by storing the filtering coefficients of the echo canceller 8 before degradation (for example, at shipping time), then storing the filtering coefficients of the echo canceller 8 and comparing both of the filtering coefficients when the echo canceller 8 operates. With this configuration, it is possible to detect, without a dedicated inspection device, the degradation of the transmission path 2 before the transmission path 2 fails. Further, in the configuration described above, it is only necessary to incorporate the degradation detection control function for the transmission path 2 in the master control circuit 7. It is thus possible to suppress an increase in manufacturing cost.

Further, in the present embodiment, it is also possible to monitora process of degradation, which occurs before the transmission path 2 is disconnected, by periodically operating the echo canceller 8 to update and accumulatively store the filtering coefficients. With this configuration, it is possible to detect the disconnection of the transmission path 2 and the connection failure of the connector and the like based on changes in the filtering coefficients of the echo canceller 8.

Second Embodiment

FIG. 6 to FIG. 9 show a second embodiment. The same configurations as the first embodiment are designated with the same reference numerals. In the second embodiment, signal generators 21, each of which generates the PRBS7 signal, are provided in the slave control circuits 15 of the plural slave communication devices 4, respectively. In the master communication device 3, an equalizer 22 is provided between an output terminal 6$a$ of the receiver circuit 6 and the input terminal 7$a$ of the master control circuit 7.

The equalizer 22 has a function of correcting distortion of the reception signal in case that the reception signal received by the receiver circuit 6 is distorted. The equalizer 22 has a function as a filtering coefficient control circuit. In this configuration, the known PRBS7 signal is transmitted from arbitrary one of the slave devices 4 and a signal distorted in passing the transmission path 2 is received by the master communication device 3. This reception signal is applied to the equalizer 22 through the receiver circuit 6 in the master communication device 3. Since a true signal of the received PRBS7 signal, that is, an original waveform of the PRBS7 signal transmitted from the slave communication device 4 is grasped in the equalizer 22, the equalizer is configured to be able to control generation of the PRBS7 signal in substantially the original waveform based on the received PRBS7 signal by adjusting the filtering coefficients of the equalizer. A method of generating the PRBS7 signal is expressed by the following equation.

$$\text{Signal(PRBS7)} = a(1) \times i(1) + a(2) \times i(2) + \ldots + a(n) \times i(n) \quad (2)$$

Here, a(n) is a filtering coefficient of the equalizer 22 and i(n) is a reception signal of the master communication device 3. A detailed circuit of the equalizer 22, which calculates the above-described equation (2), is formed of generally the similar circuit configuration of the echo canceller 8 shown in FIG. 2, for example, a delay circuit, a filtering coefficient control circuit, a multiplier and an adder. By automatically adjusting the filtering coefficients a(1) to a(n) of the equalizer 22 so that the signal inputted to the receiving terminal 7$a$ of the master control circuit 7 is restored to the PRBS7 signal of the original waveform, the equalizer 22 outputs the adjusted filtering coefficients a(1) to a(n) to the master control circuit 7.

Since the filtering coefficients a(1) to a(n) of the equalizer 22 are data corresponding to a magnitude of distortion the signal, which is inputted to the master communication device 3, these are data corresponding to the transmission characteristic of the transmission path 2 between the slave communication devices 4 and the master communication device 3. Accordingly, it is possible to check whether the transmission path 2 between the slave communication device 4 and the master communication device 3 is degraded by checking a change in each value of the filtering coefficients a(1) to a(n).

In the present embodiment, the master control circuit 7 acquires pre-degradation filtering coefficients a(1) to a(n) of the transmission path 2 between the slave communication device 4 and the master communication device 3 (for example, at time of factory shipment or initial production) from the equalizer 22 and stores in the internal memory (for example, EEPROM or flash memory). The master control circuit 7 is configured to acquire and store, when the equalizer 22 operates to control the signal inputted to the receiving terminal 7$a$ of the master control circuit 7 to the PRBS7 signal of the original waveform, the filtering coefficients a(1) to a(n) at that time in the memory. The equalizer 22 is configured to check whether the transmission path 2 between the slave communication device 4 and the master communication device 3 has the degradation or failure by comparing the latest filtering coefficients a(1) to a(n) stored in the memory with the pre-degradation filtering coefficients a(1) to a(n) stored in the memory.

Further, in the present embodiment, each of the remaining slave communication devices 4 is configured to transmit the known PRBS7 signal to the transmission path 2 so that a signal distorted in the transmission path 2 between the remaining slave communication devices 4 and the master communication device 3 is received by the master communication device 3. The master communication device 3 is configured to control generation of the PRBS7 signal of the original waveform based on the received PRBS7 signal by adjusting the filtering coefficients of the equalizer 22 and store the filtering coefficients a(1) to a(n) at this time in the memory of the master control circuit 7.

The master control circuit 7 is configured to check, with respect to each transmission path 2 between the remaining slave communication devices 4 and the master communication device 3, whether the transmission path 2 is deteriorated by comparing the latest filtering coefficients a(1) to a(n) stored in the memory and the pre-degradation filtering coefficients a(1) to a(n) stored in the memory. The processing of the equalizer 22 is executed mainly in the start-up process, which is until normal communication is executed. The processing of the equalizer 22 is preferably executed periodically (for example, once in a day or week).

It is noted that, although not shown in the figure, the echo canceller 8 described in the first embodiment is provided within the master communication device 3 to execute echo canceling processing in the second embodiment. It is noted further that, although not shown in the figure, the equalizer 22 of the second embodiment is provided within the master communication device 3 in the first embodiment and the signal generator 21 of the second embodiment is provided within the slave control circuit 15 of the slave communication device 4 of the first embodiment thereby to execute distortion correction processing for the reception signal is executed.

Figure 6:
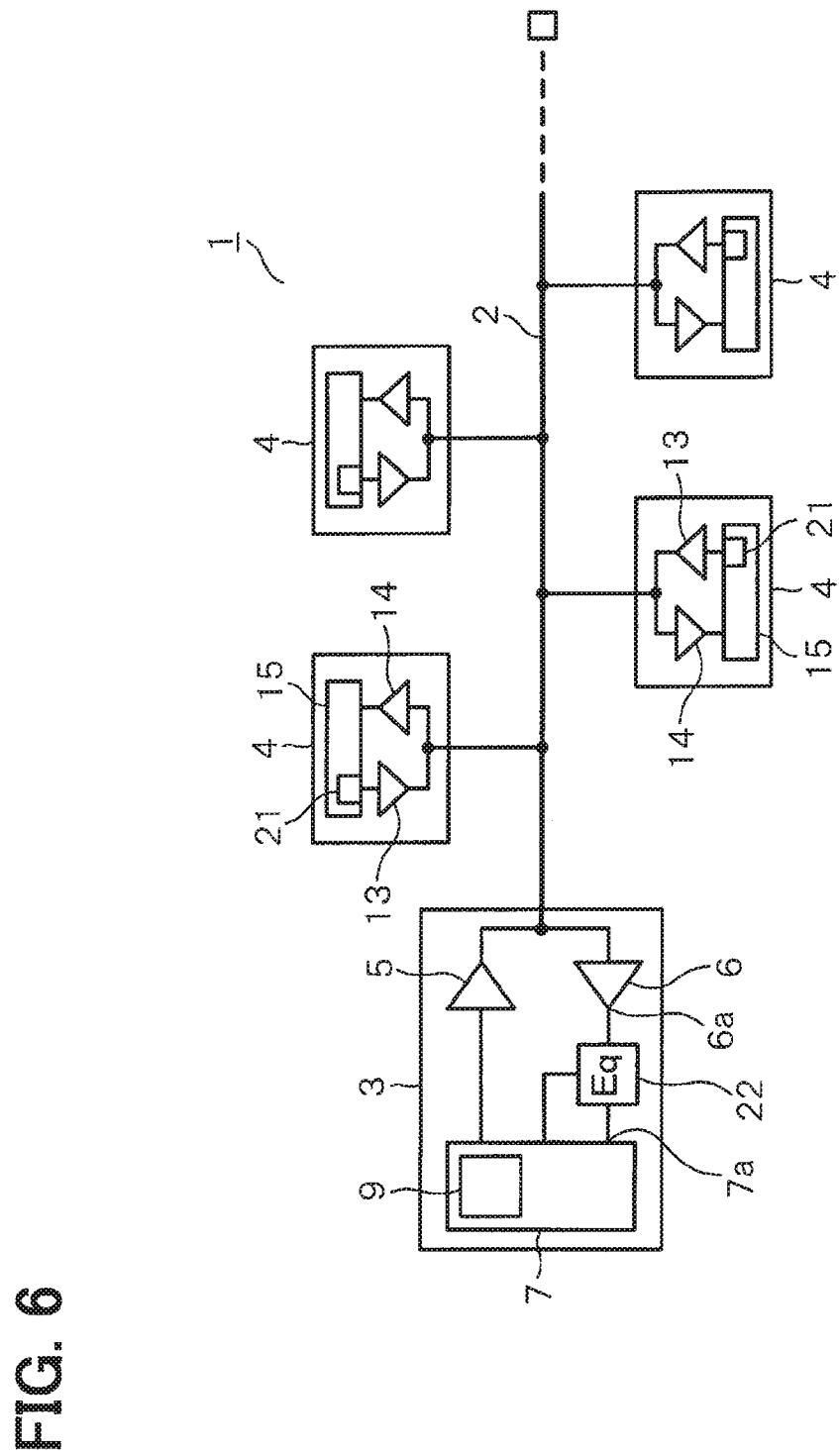
FIG. 6 is an electric configuration diagram showing a whole general configuration of a transmission system according to a second embodiment.
Figure 7:
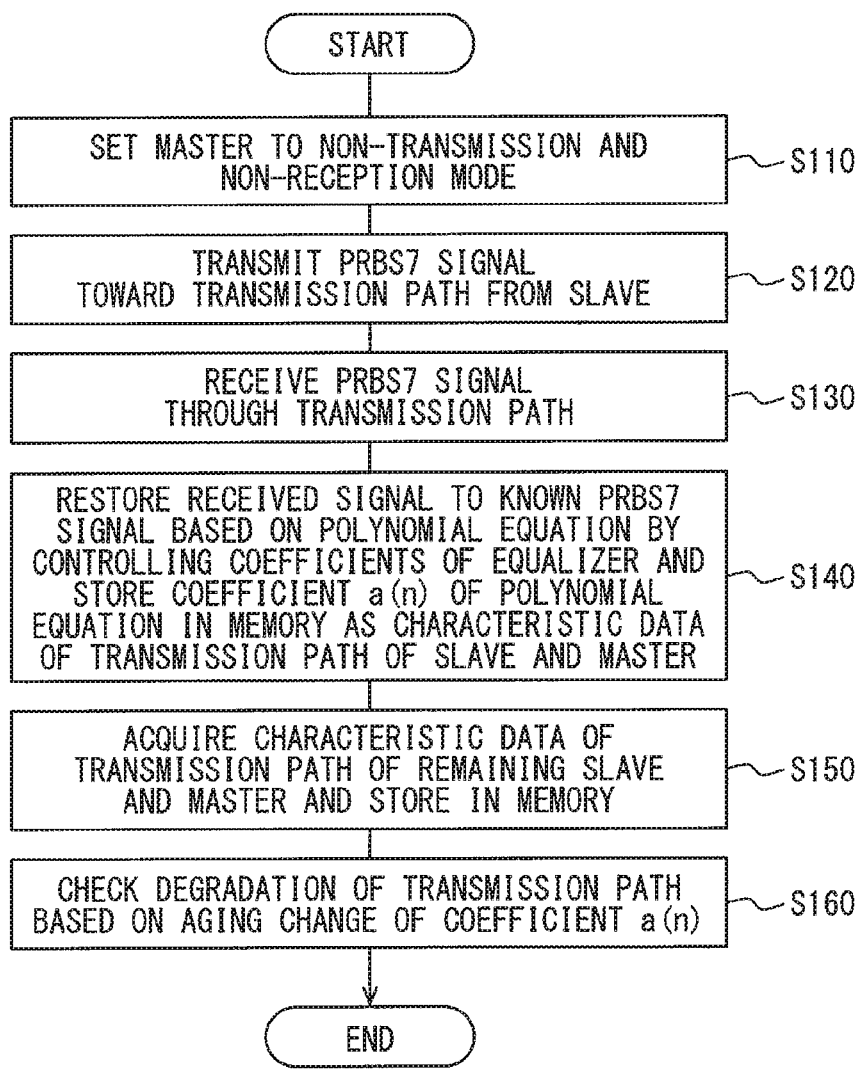
FIG. 7 is a flowchart of a degradation check control.

A flowchart of FIG. 7 shows control contents for checking degradation of the transmission path 2 in the control of the master control circuit 7 of the second embodiment. First, at step S110, the master control circuit 7 of the master communication device 3 sets the master communication device 3 to be in an operation mode of non-transmission and non-reception. Next, at step S120, the master control circuit 7 transmits a control signal, which instructs a first one of the slave communication devices 4 (that is, upper left in FIG. 6) for example to transmit the PRBS7 signal so that the first slave communication device 4 transmits the PRBS7 signal to the transmission path through the driver circuit 13.

Then, at step S130, the master communication device 3 receives the PRBS7 signal through the transmission path 2. Then at step S140, in the master communication device 3, the equalizer 22 adjusts the signal inputted to the receiving terminal of the master control circuit 7 to be restored to the PRBS7 signal having the original waveform based on the equation (2) by controlling the filtering coefficients a(1) to a(n). Since the adjusted filtering coefficients a(1) to a(n) are characteristic data, which indicate a present characteristic of the transmission path 2 between the first slave communication device 4 at this time and the master communication device 3, these filtering coefficients a(1) to a(n) are stored in the memory within the master control circuit 7.

Then at step S150, the master control circuit 7 executes the same processing (that is, step S120 to step S140) as that executed for the first slave communication device 4 for each of the remaining slave communication devices 4 in sequential order, for example, from a second one of the slave communication devices 4 (lower left in FIG. 6). Specifically, the master control circuit 7 operates the equalizer 22 on the PRBS7 signal, acquires the filtering coefficients a(1) to a(n) and store in the memory. Thus, the filtering coefficients a(1) to a(n) indicating the characteristic of each transmission path 2 between the slave communication device 3 of the second, third and the like and the master communication device 3 are stored in the memory within the master control circuit 7.

Then, at step S160, the master control circuit 7 checks the degradation, failure and the like of the transmission path 2 between the slave communication device 4 of the first, second and the like and the master communication device 3 at this time based on a secular change of the filtering coefficients a(1) to a(n). Specifically, with respect to each transmission path 2 between the slave communication device 4 of the first, second and the like and the master communication device 3, the master control circuit 7 individually checks the degradation and the like of each transmission path 2 of the first, second and the like and the master communication device 3 at this time individually by comparing the pre-degradation filtering coefficients a(1) to a(n), which are stored in the memory before degradation, for example, at shipping time, with the latest filtering coefficients a(1) to a(n) stored in the memory.

Figures 8, 9:
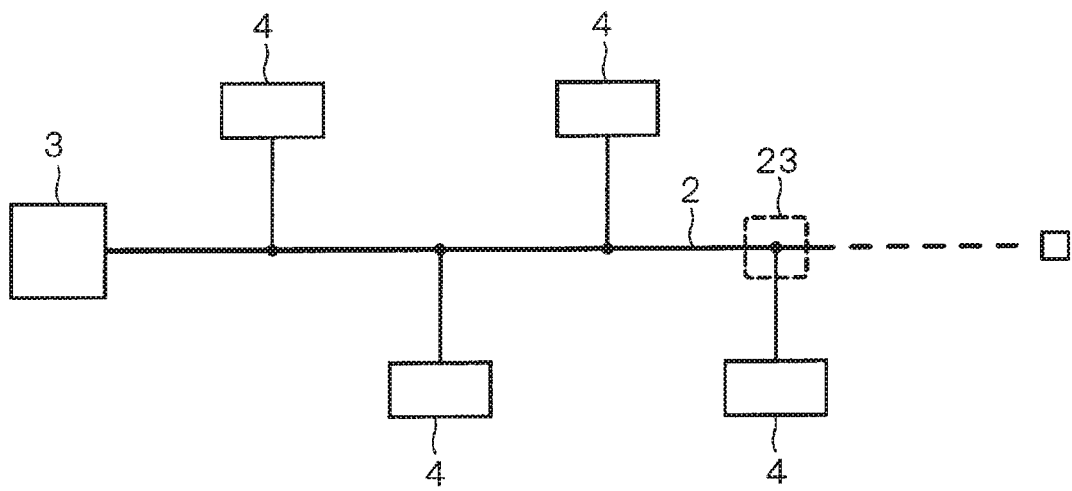
FIG. 8 is a diagram explaining a location of degradation in the transmission system.
FIG. 9 is a diagram showing an example of variations of filtering coefficients a(1) to a(n)

It is assumed here that a connector 23, which connects the fourth slave communication device 4 (lower right) and the transmission path 2 as shown in FIG. 8, is degraded for example. In this case, the coefficients a(1) and a(2) among the filtering coefficients a(1) to a(n), which indicate the characteristic of the transmission path 2 between the fourth slave communication device 4 and the master communication device 3 at this time, changes largely in an increasing direction as indicated in a table of FIG. 9. Accordingly, the master control circuit 7 is configured to determine that the transmission path 2 between the fourth slave communication device 4 and the master communication device 3 is degraded in case that such a large change as indicated in the table of FIG. 9 is detected.

The master control circuit 7 is configured to notify a user of a message or the like, which indicates the degradation of the transmission path 2, in case that the degradation of the transmission path 2 is determined. It is noted in this case that, since the filtering coefficients a(1) to a(n) indicating the characteristic of each transmission path 2 between the slave communication device 4 other than the fourth one and the master communication device 3 do not change largely, the master control circuit 7 determines no degradation of the transmission path of such slave communication devices. Thus the control shown in FIG. 7 is finished.

The large change in the filtering coefficients a(1) to a(n) described above is considered to arise from impedance mismatching, which is caused by degradation, disconnection or the like of the transmission path 2. The master control circuit 7 is configured to execute the control shown in FIG. 7 in the startup process or periodically.

The second embodiment is configured the same as the first embodiment except for the configuration described above. For this reason, the second embodiment also provides substantially the same function and advantage of the first embodiment. According to the second embodiment, particularly, it is possible to determine a place and position of occurrence of the degradation, failure or the like in the transmission path 2, that is, the transmission path 2 between the particular one of the slave communication devices 4 and the master communication device 3 among transmission paths between the plural slave communication devices 4 and the master communication device 3.

Third Embodiment

Figure 10:
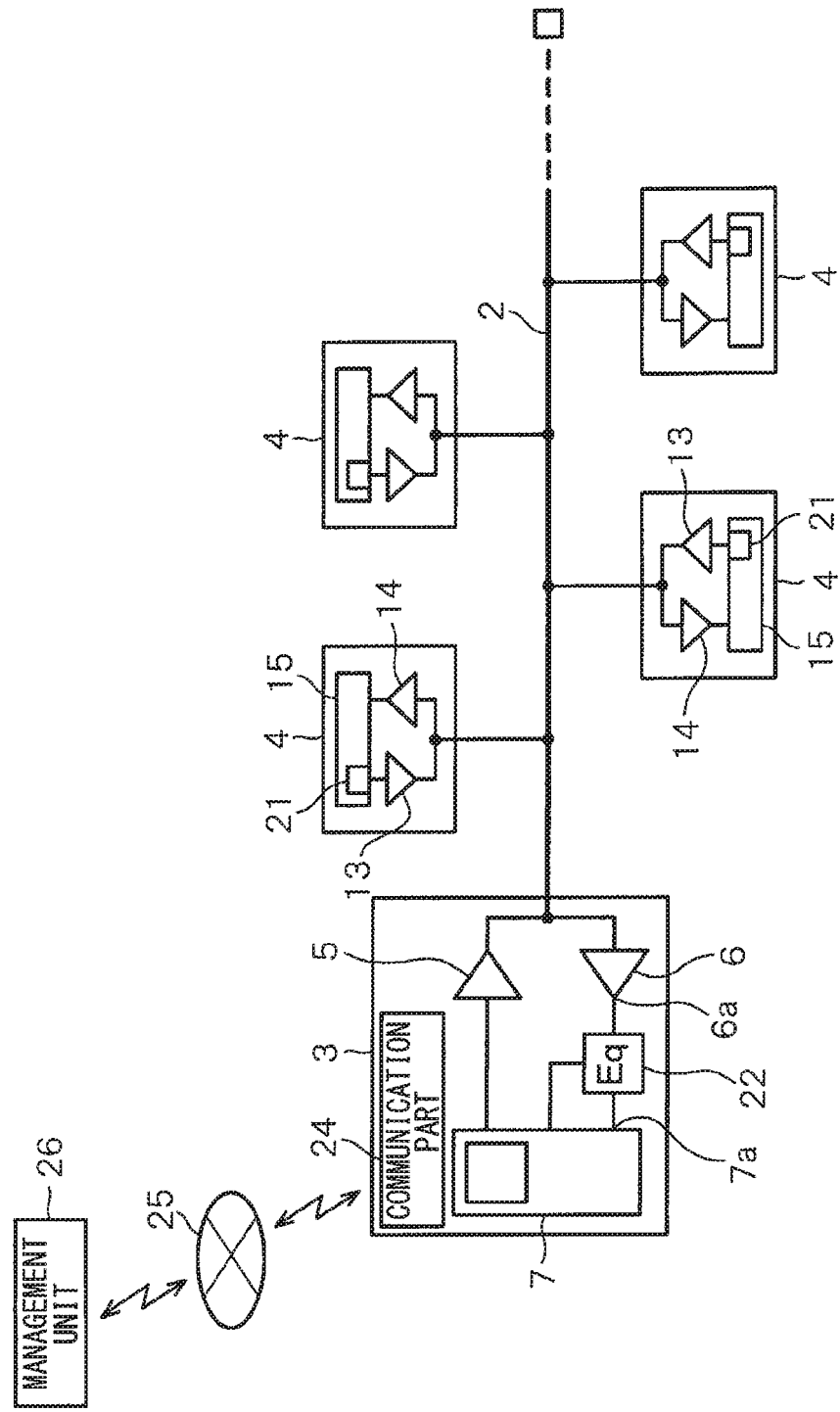
FIG. 10 is an electric block diagram showing a whole general configuration of a transmission system according to a third embodiment.
Figure 11:
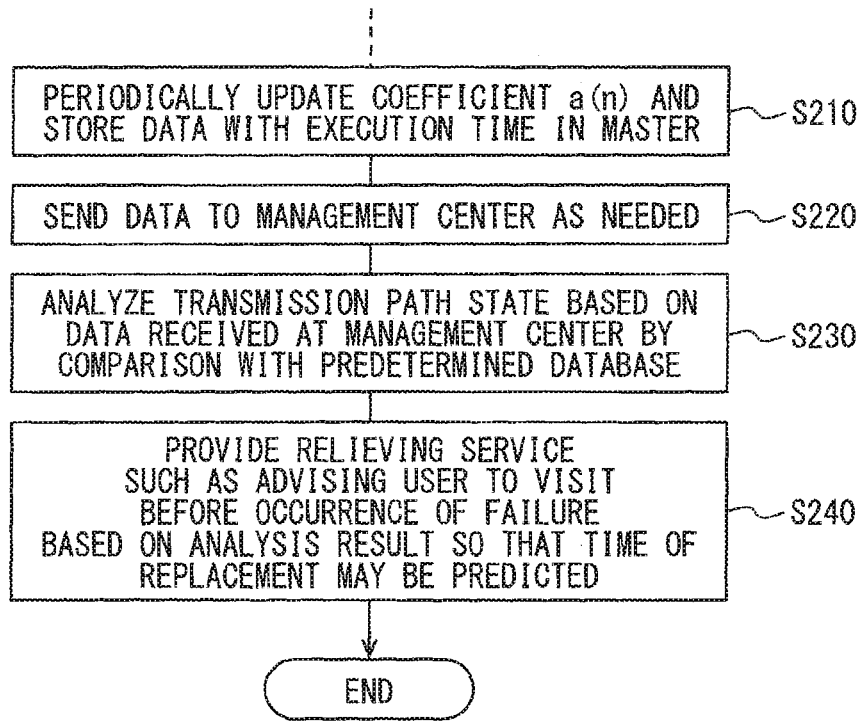
FIG. 11 is a flowchart of a degradation check control.

FIG. 10 and FIG. 11 show a third embodiment, The same configurations as the second embodiment are designated with the same reference numerals. In the third embodiment, a communication part 24 is provided in the master control device 3 and the master control circuit 7 is configured to be able to communicate with a management device 26 of a management center through the communication part 24 and a communication network 25. The communication network 25 is formed of a mobile phone network, Internet or the like. The management device 26 is formed of a computer such as a server, for example.

FIG. 11 shows a flowchart of a degradation detection control according to the third embodiment. Before execution of step S210 of FIG. 11, the master control circuit 7 of the master communication device 3 executes the processing of steps s110 to step S150 of the second embodiment shown in FIG. 7. Then, at step S210 shown in FIG. 11, the master control circuit 7 of the master communication device 3 stores the data of the filtering coefficients a(1) to a(n), which have been updated periodically or in the start-up process by execution of steps s110 to s150, in an area of the internal memory for uploading to the management center. At this time, data of update time of updating of the filtering coefficients a(1) to a(n) are also stored in the that area.

Then at step S220, the master control circuit 7 transmits (that is, uploads) the data of updated filtering coefficients a(1) to a(n) and update time to the management device 26 of the management center through the communication part 24 and the communication network 25 from time to time (for example, each time of execution of step S210).

At step S230, the management device 26 of the management center receives the data of the filtering coefficients a(1) to a(n) and the update time transmitted from the master communication device 3 and stores received data of the filtering coefficients a(1) to a(n) and the update time in its internal memory (for example, hard disk or the like). Further, the management device 26 analyzes the state of the transmission path 2, that is, level of degradation or failure, based on the received data of the filtering coefficients a(1) to a(n) and the update time and a predetermined, database stored in the internal memory for checking degradation.

Then, the management device 26 executes step S240 to provide a secure service, which recommends a user to visit a shop before a failure arises, because it is possible to predict time of exchange of a component part based on a result of analysis of the state of the transmission path 2. It is preferred in this case to notify the user by transmitting a message, which indicates the recommended visit to the shop for repair, to the master communication device 3 through the communication network 25, when time of a component part exchange approaches for example. In case that the transmission system 1 according to the present embodiment is provided in a vehicle, the user may visit the shop indicated in the message by using the vehicle.

The third embodiment is configured the same as the second embodiment except for the configuration described above. For this reason, the third embodiment also provides substantially the same function and advantage of the second embodiment. According to the second embodiment, it is possible to store the data of the updated filtering coefficients a(1) to a(n) and the update time in the memory of a large storage capacity in the management device 26 and hence to store a large volume of the data of the filtering coefficients a(1) to a(n) and the update time periodically from a state, which is before degradation. It is thus possible to analyze the state of the transmission path 2 based on the large volume of the data stored as described above and a predetermined database stored for checking the degradation in the management device 26 and hence to raise an accuracy in detecting the degradation.

Fourth Embodiment

Figure 12:
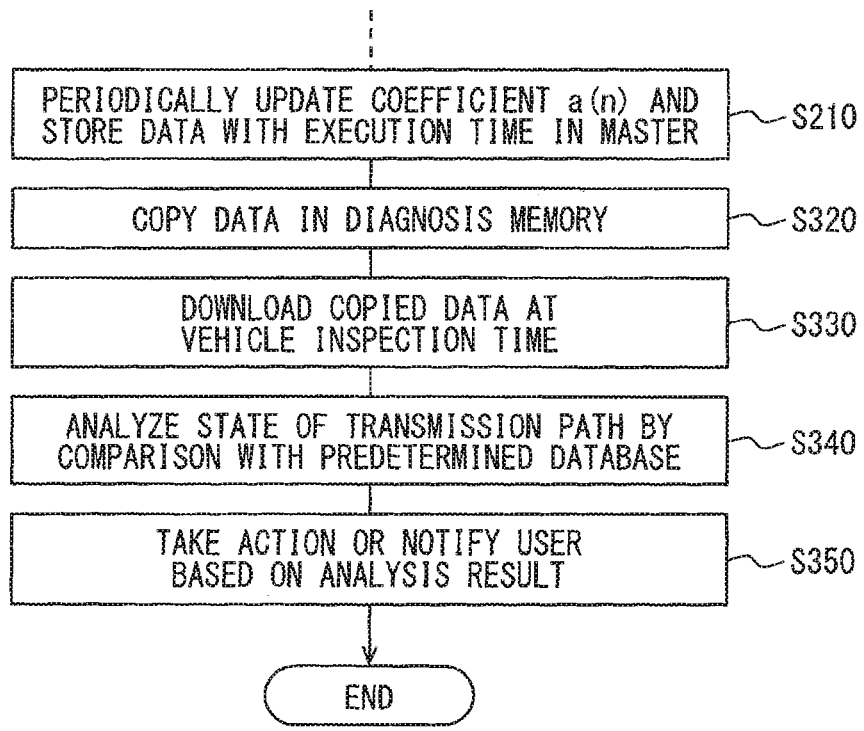
FIG. 12 is a flowchart of degradation check control according to a fourth embodiment.

FIG. 12 shows a fourth embodiment. The same configurations as the third embodiment are designated with the same reference numerals. In the fourth embodiment, the transmission system is configured to be provided in a vehicle, for example. That is, the transmission system is configured to store the data of the filtering coefficients a(1) to a(n) and the update time are stored in a diagnosis memory provided in the vehicle in place of storing such data in the memory of the management device 26 of the management center.

FIG. 12 shows a flowchart of a degradation detection control according to the fourth embodiment. Before execution of step S210 of FIG. 12, the master control circuit 7 of the master communication device 3 executes the processing of steps S110 to S150 of the second embodiment shown in FIG. 7. Then, at step S210 shown in FIG. 12, the master control circuit 7 of the master communication device 3 stores the data of the filtering coefficients a(1) to a(n), which have been updated periodically or in the start-up process by execution of steps S110 to S150, in the area of the internal memory for storage in the diagnosis memory. At this time, data of update time of updating of the filtering coefficients a(1) to a(n) are also stored in the that area.

Then, at step S320, the master control circuit 7 stores (that is, copies) the data of the updated filtering coefficients a(1) to a(n) and the update time in the diagnosis memory provided in the vehicle from time to time (for example, at execution of step S210).

Then, at step S330, the data of the filtering coefficients a(1) to a(n) and the update time stored in the diagnosis memory in the vehicle are retrieved (that is, downloaded) by a service person at the shop, when the user visits the shop by the vehicle for inspection or the like. These data are stored in a memory of a management device (for example, server or terminal computer) in the shop.

Further, at step S340, the management device of the shop analyzes the state, that is, level of degradation or failure, of the transmission path 2 based on the stored data of the filtering coefficients a(1) to a(n) and the update time and a predetermined database stored in its internal memory for checking the degradation.

Then, at step S350, the management device in the shop provides a secure service, which recommends a user to visit the shop before a failure arises, because it is possible to predict time of exchange of a component part based on a result of analysis of the state of the transmission path 2. For example, it is preferred that the management device displays on a display device a message or notifies the user by a mail a message, which indicates the recommended visit to the shop for repair, when time of the component part exchange approaches for example. A person in the shop may notify the user of the message by phone after confirming it, which is displayed on the management device.

The fourth embodiment is configured the same as the third embodiment except for the configuration described above. For this reason, the fourth embodiment also provides substantially the same function and advantage of the third embodiment.

In the third embodiment and the fourth embodiment, the processing of steps S110 to S150 of the second embodiment shown in FIG. 7 is executed before execution of step S210 of FIG. 11 and FIG. 12. However, alternatively, the processing of step S10 to step S40 of the first embodiment shown in FIG. 3 may be executed. According to this configuration, the filtering coefficients c(1) to c(n) of the echo canceller 8 are used in place of the filtering coefficients a(1) to a(n) of the equalizer 22. This configuration also provides substantially the similar functions and advantages as those of the third embodiment and the fourth embodiment.

Further, the PRBS7 signal is used, for example, as the pseudo-communication signal in each embodiment described above. However, other signals may alternatively be used. In addition, the echo canceller 8 and the equalizer 22 are used as the filtering coefficient control circuit in each embodiment described above. However, other circuits may alternatively be used.

While the present disclosure has been described with reference to embodiments thereof, it is to be noted that the disclosure is not limited to the embodiments and configurations. The present disclosure is intended to cover various modification and equivalent arrangements. In addition, while the various combinations and configurations, other combinations and configurations, including more, less or only a signal element, are also within the spirit and scope of the present disclosure,

The invention claimed is:

1. A transmission-path degradation detection apparatus comprising:
   a transmission path of a transmission system capable of communication by way of bus-connected communication; and
   plural communication devices including a master communication device and plural slave communication devices connected to the master communication device through the transmission path, wherein:
   the master communication device is configured to generate a control signal to one of the plural slave communication devices to instruct generation of a pseudo-communication signal of an original waveform;
   each of the plural slave communication devices includes a signal generation circuit configured to generate the pseudo-communication signal under a state that the master communication device is in a predetermined mode of no signal transmission and no signal reception; and
   the master communication device includes a degradation detection circuit configured to detect a degradation of the transmission path by performing predetermined processing on the pseudo-communication signal received through the transmission path in the predetermined mode of no signal transmission and no signal reception.

2. The transmission-path degradation detection apparatus according to claim 1 further comprising:
   a filter coefficient control circuit provided in the master communication device of the plural communication devices for receiving the pseudo-communication signal passing through the transmission path and having a function of automatically controlling filtering coefficients based on a received pseudo-communication signal,
   wherein the degradation detection circuit is configured to detect the degradation of the transmission path based on a comparison of the filtering coefficients with predetermined filtering coefficients stored to indicate a path characteristic between the master communication device and the slave communication device, which transmits the pseudo-communication signal.

3. The transmission-path degradation detection apparatus according to claim 2, wherein:
   the filtering coefficient control circuit is formed of an echo canceller.

4. The transmission-path degradation detection apparatus according to claim 2, wherein:
   the filtering coefficient control circuit is formed of an equalizer.

5. The transmission-path degradation detection apparatus according to claim 2 further comprising:
   a management device of a management center for communication with the master communication device of the plural communication devices,
   wherein the master communication device is configured to transmit the filtering coefficients to the management device of the management center, and
   the management device of the management center is configured to detect the degradation of the transmission path based on a comparison of the filtering coefficients transmitted from the master communication device with predetermined filtering coefficients stored to indicate a transmission path characteristic between the master communication device and the slave communication device, which transmits the pseudo-communication signal.

6. A transmission-path degradation detection apparatus comprising:
   a transmission path of a transmission system capable signal communication by way of bus-connected communication;
   a master communication device connected to the transmission path and including an equalizer and a master control circuit; and
   plural slave communication devices connected to the transmission path at different positions for communication with the master communication device through the transmission path, wherein:
   each of the slave communication devices is configured to generate a pseudo-communication signal to be transmitted to the master communication device through the transmission path in response to an instruction from the master communication device;
   the equalizer operates to determine filter coefficients, which make the pseudo-communication signal received from the transmission path to correspond to the pseudo-communication signal and indicate a transmission path characteristic between the slave communication device, which generated the pseudo-communication signal and the master communication device; and
   the master control circuit is configured to detect a degradation of the transmission path by a comparison of the filter coefficients determined by the equalizer and predetermined filter coefficients stored to indicate a path characteristic between the master communication device and the slave communication device, which transmits the pseudo-communication signal, wherein
   at least one of the slave communication devices is configured to generate the pseudo-communication signal when the master communication device is in a predetermined mode of transmitting and receiving no signal.

7. The transmission-path degradation detection apparatus according to claim 6, wherein:
   each of the slave communication devices is configured to generate the pseudo-communication signal when the master communication device is in the predetermined mode of transmitting and receiving no signal.

8. A transmission-path degradation detection apparatus comprising:
- a transmission path of a transmission system capable signal communication;
- a master communication device connected to the transmission path and including an equalizer and a master control circuit; and
- plural slave communication devices connected to the transmission path for communication with the master communication device through the transmission path,
- wherein the master control circuit of the master communication device is configured to execute processing of:
  - setting the master communication device to a predetermined mode of transmitting and receiving no signal;
  - transmitting a control signal to one of the plural slave communication devices to instruct generation of a pseudo-communication signal of an original waveform;
  - receiving the pseudo-communication signal generated by the one of the plural slave communication devices and transmitted through the transmission path, the equalizer adjusting a waveform of a received pseudo-communication signal to the original waveform of the pseudo-communication signal generated by the one of the plural slave communication devices by varying filter coefficients;
  - storing the filter coefficients, which make the waveform of the received pseudo-communication signal equal to the original waveform of the pseudo-communication signal, for comparison with predetermined filter coefficients indicating a transmission characteristic of the transmission path between the master communication device and the one of the slave communication devices and detection of a deterioration of the transmission path; and
  - repeating the processing of setting, transmitting, receiving and storing by changing the one of the plural slave communication devices.

9. The transmission-path degradation detection apparatus according to claim 8, wherein the master control circuit is further configured to execute processing of:
- detecting the deterioration of the transmission path between the master communication device and the one of the plural slave communication devices based on the stored filter coefficients with the predetermined filter coefficients.

10. The transmission-path degradation detection apparatus according to claim 8, further comprising:
- a management center provided separately from the master communication device and configured to receive the filter coefficients stored in the master control circuit and detect the deterioration of the transmission path between the master communication device and the one of the plural slave communication devices based on the stored filter coefficients received from the master control device with the predetermined filter coefficients,
- wherein the master communication device further includes a communication circuit for transmitting the stored filter coefficients of the equalizer to the management center.

* * * * *